(12) United States Patent
Hammerschmidt et al.

(10) Patent No.: US 10,931,314 B2
(45) Date of Patent: *Feb. 23, 2021

(54) METHOD AND APPARATUS FOR PROVIDING A JOINT ERROR CORRECTION CODE FOR A COMBINED DATA FRAME COMPRISING FIRST DATA OF A FIRST DATA CHANNEL AND SECOND DATA OF A SECOND DATA CHANNEL AND SENSOR SYSTEM

(71) Applicant: Infineon Technologies AG, Neubiberg (DE)

(72) Inventors: Dirk Hammerschmidt, Villach (AT); Friedrich Rasbornig, Klagenfurt (AT); Wolfgang Scheibenzuber, Munich (DE); Wolfgang Scherr, Villach Landskron (AT); Thomas Zettler, Hoehenkirchen-Siegertsbrunn (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/284,821

(22) Filed: Feb. 25, 2019

(65) Prior Publication Data

US 2019/0199376 A1 Jun. 27, 2019

Related U.S. Application Data

(63) Continuation of application No. 15/003,230, filed on Jan. 21, 2016, now Pat. No. 10,298,271, which is a (Continued)

(30) Foreign Application Priority Data

Aug. 14, 2015 (DE) .......................... 102015113480.2

(51) Int. Cl.
*H03M 13/00* (2006.01)
*H03M 13/29* (2006.01)
(Continued)

(52) U.S. Cl.
CPC ....... *H03M 13/2909* (2013.01); *H03M 13/29* (2013.01); *H03M 13/2903* (2013.01);
(Continued)

(58) Field of Classification Search
CPC ......... H03M 13/2909; H03M 13/2942; H03M 13/29; H03M 13/2906; H03M 13/2903;
(Continued)

(56) References Cited

U.S. PATENT DOCUMENTS 5,583,297 A 12/1996 Stocker et al.
5,589,766 A 12/1996 Frank et al.
(Continued)

FOREIGN PATENT DOCUMENTS

CN 1228836 A 9/1999
CN 1604326 A 4/2005
(Continued)

OTHER PUBLICATIONS

Co-pending U.S. Appl. No. 16/024,339, filed Jun. 29, 2018 (entitled "Stressed Decoupled Micro-Electro-Mechanical System Sensor," by Theuss, Horst, 43 pages.
(Continued)

*Primary Examiner* — Samir W Rizk
(74) *Attorney, Agent, or Firm* — Harrity & Harrity, LLP

(57) ABSTRACT

An apparatus (100) for providing an joint error correction code (140) for a combined data frame (254) comprising first data (112) of a first data channel and second data (122) of a second data channel comprises a first error code generator (110) configured to provide, based on a linear code, information on a first error correction code (114a, 114b) using the
(Continued)

first data (112). The apparatus further comprises a second error code generator (120) configured to provide, based on the linear code, information on a second error correction code (124) using the second data (122). The apparatus is configured to provide the joint error correction code (140) using the information on the first error correction code (114a, 114b) and the information on the second error correction code (124).

20 Claims, 11 Drawing Sheets

Related U.S. Application Data continuation-in-part of application No. 15/002,587, filed on Jan. 21, 216, now Pat. No. 10,289,508.

(60) Provisional application No. 62/111,557, filed on Feb. 3, 2015.

(51) Int. Cl.
| | |
|---|---|
| *H04L 1/00* | (2006.01) |
| *H03M 13/35* | (2006.01) |
| *H03M 13/15* | (2006.01) |
| *H03M 13/13* | (2006.01) |
| *G06F 11/08* | (2006.01) |
| *G06F 11/10* | (2006.01) |

(52) U.S. Cl.
CPC ... *H03M 13/2906* (2013.01); *H03M 13/2942* (2013.01); *H03M 13/353* (2013.01); *H03M 13/611* (2013.01); *H04L 1/0041* (2013.01); *H04L 1/0057* (2013.01); *H04L 1/0064* (2013.01); *G06F 11/08* (2013.01); *G06F 11/10* (2013.01); *G06F 11/102* (2013.01); *H03M 13/13* (2013.01); *H03M 13/136* (2013.01); *H03M 13/155* (2013.01); *H03M 13/1555* (2013.01); *H03M 13/1595* (2013.01); *H03M 13/6356* (2013.01); *H04L 1/0043* (2013.01); *H04L 1/0056* (2013.01); *H04L 1/0076* (2013.01); *H04L 1/0077* (2013.01)

(58) Field of Classification Search
CPC ............. H03M 13/353; H03M 13/611; H03M 13/1595; H03M 13/13; H03M 13/1555; H04L 1/0064; H04L 1/0041; H04L 1/0057; H04L 1/0076; H04L 1/0043; H04L 1/0077

See application file for complete search history.

(56) References Cited

U.S. PATENT DOCUMENTS

| | | | |
|---|---|---|---|
| 5,713,668 | A | 2/1998 | Lunghofer et al. |
| 6,525,544 | B1 | 2/2003 | Okada et al. |
| 6,651,212 | B1 | 11/2003 | Katayama et al. |
| 6,908,227 | B2 | 6/2005 | Rusu et al. |
| 6,960,974 | B2 | 11/2005 | Wan et al. |
| 7,255,010 | B2 | 8/2007 | Ausserlechner et al. |
| 9,046,556 | B2 | 6/2015 | Fugate et al. |
| 9,112,529 | B1 | 8/2015 | Mazahreh et al. |
| 2002/0039893 | A1 | 4/2002 | Ylamurto et al. |
| 2005/0257605 | A1 | 11/2005 | Colvin et al. |
| 2006/0123322 | A1 | 6/2006 | Leung et al. |
| 2007/0165709 | A1 | 7/2007 | Walker et al. |
| 2007/0261492 | A1 | 11/2007 | Board et al. |
| 2007/0262831 | A1 | 11/2007 | Van et al. |
| 2009/0268662 | A1 | 10/2009 | Larsson et al. |
| 2010/0301332 | A1 | 12/2010 | Dibra et al. |
| 2011/0194221 | A1 | 8/2011 | Ohta et al. |
| 2013/0200909 | A1* | 8/2013 | Rasbornig ......... B60W 50/0205 324/750.3 |
| 2014/0019822 | A1 | 1/2014 | Esumi et al. |
| 2014/0245098 | A1 | 8/2014 | Sharon et al. |
| 2014/0269505 | A1 | 9/2014 | Medard et al. |
| 2015/0256289 | A1 | 9/2015 | Emami et al. |
| 2015/0318869 | A1 | 11/2015 | Hung et al. |
| 2015/0363263 | A1 | 12/2015 | Hassner et al. |
| 2016/0084937 | A1* | 3/2016 | Lin ......................... G01S 5/18 367/13 |
| 2016/0223610 | A1 | 8/2016 | Hammerschmidt et al. |
| 2017/0138185 | A1 | 5/2017 | Saed et al. |

FOREIGN PATENT DOCUMENTS

| | | |
|---|---|---|
| CN | 1692326 A | 11/2005 |
| CN | 1841973 A | 10/2006 |
| CN | 1891002 A | 1/2007 |
| CN | 101312387 A | 11/2008 |
| CN | 103512586 A | 1/2014 |
| CN | 104048692 A | 9/2014 |
| DE | 102015215412 A1 | 2/2016 |
| KR | 100391240 B1 | 7/2003 |
| WO | WO-2004045075 A1 | 5/2004 |

OTHER PUBLICATIONS

Co-pending U.S. Appl. No. 14/462,844, filed Aug. 19, 2014 (entitled "Protected Transmission of Independent Sensor Signals," by Hammerschmidt,), 33 pages.

Seeger K., Semiconductor Physics: An Introduction, 9th Edition, Springer Verlag, 2004, 8 pages.

Weste N., et al., "CMOS VLSI Design: A Circuits and Systems Perspective," Addison Wesley Longman, 2010, 3 pages.

* cited by examiner

METHOD AND APPARATUS FOR PROVIDING A JOINT ERROR CORRECTION CODE FOR A COMBINED DATA FRAME COMPRISING FIRST DATA OF A FIRST DATA CHANNEL AND SECOND DATA OF A SECOND DATA CHANNEL AND SENSOR SYSTEM

RELATED APPLICATIONS

This application is a continuation of U.S. patent application Ser. No. 15/003,230, filed on Jan. 21, 2016, which is a continuation-in-part of U.S. patent application Ser. No. 15/002,587, filed on Jan. 21, 2016, which claims priority to U.S. Provisional Application No. 62/111,557 filed Feb. 3, 2015, the contents of which are incorporated by reference herein in their entirety. This application claims priority under 35 U.S.C. § 119 to German Patent Application No. 102015113480.2 filed on Aug. 14, 2015, the content of which is incorporated by reference herein in its entirety.

FIELD

Embodiments relate to a method for providing a joint error correction code for a combined data frame comprising first data of a first data channel and second data of a second data channel as well as to a corresponding apparatus and to a sensor system using the method to transmit data emanating from two data channels.

BACKGROUND

Combining data originating from a first data channel and from a second data channel into a combined data frame in order for joint transmission within the combined data frame is a common use case. For example, when data of two distinct environmental sensors is collected, the data of both sensors is often required to be transmitted by means of a single communication channel. In order to determine, whether data has been corrupted while being transmitted over the communication channel, which may be a wireline or a wireless communication link, error correction codes can be used which add some redundant information to the data. The added redundancy allows determining whether data is being corrupted while being transmitted, or not. The error detection capability, i.e. the extent to which a corruption of data can still be discovered (e.g. in terms of a number of bits being flipped while transmitted) depends on the particular error correction code used to determine the redundant information.

One particular use case are automotive applications where functional safety is an issue of rising importance. In order to guarantee functional safety of sensor systems, independent sensor signals for the same physical quantity are often transmitted in order to be able to compare the sensor signals on the receiving side, for example at an electronic control unit (ECU). Independence of the sensor data may be required in order to allow for a proper control mechanism and can often be achieved by use of different sensor technologies, different location of the sensors, different data rates, different sampling phases, different electrical setup of the sensor bias and readout, different measurement ranges, different encoding, different signal processing or combinations of the previously-listed measures. The use of an independent communication interface for each independent data source, however, causes more effort, more pins for a sensor package and the necessity to implement redundant wiring within the vehicle. In order to avoid the cost and weight sensitive issue of redundant wiring and in order to maintain compatibility with existing solutions and wiring schemes, first data of the first sensor and second data of the second sensor may be jointly transmitted within a combined data frame and a common communication interface. In other applications requiring joint transmission of data, first data emanating from the first sensor may be characterized as a first data coming from a first data channel and the second data of the second sensor may be characterized as a second data of a second channel.

One task is to combine the first data of the first data channel and the second data of the second data channel in a combined data frame for transmission, additionally providing a joint error correction code allowing to, at least, determine whether data is corrupted while being transmitted over the common data channel. In particular, in functional safety applications, eventually not only the transmission channel should to be covered, but also the computing entities or the hardware combining the data into the common frame and generating the error correction code. One way forward would be to use independent error code generators within each of the data channels, providing two distinct error correction codes and to assemble a combined frame using a first error correction code for the first data and a second error correction code for the second data. However, this may end up with a data frame comprising an excessive amount of data for the error correction code without any additional benefit. Alternatively, one may provide a combined data frame having the first and the second data multiplexed in the combined data frame before processing the combined data frame by an additional, subsequent error code generator. However, having no control over the joint error code generator and the frame assembly, the ability to diagnose whether data has been modified while being processed by the jointly used processing blocks including the error code generator would be lost. Control may be achieved by an exchange of the entire first data and second data between the two data channels so that each of the data channels (having its own error code generator) is in possession of the full information of the first data as well as of the second data. The error correction code generators may then individually process an error correction code for the full data which may then be compared so as to conclude, whether a hardware failure occurred in the generation of the error correction code. However, this implementation is costly in terms of additionally required hard-/or software as well as additional processing time.

There appears to be a desire to improve efficiency and reliability of the generation of an error correction code for a combined data frame having data of a first data channel as well as data of a second data channel.

SUMMARY

According to some embodiments, a method for providing a joint error correction code for a combined data frame comprising first data of a first data channel and second data of a second data channel provides, based on a linear code, information on a first error correction code using the first data. The method further provides, based on the linear code, the information on the second error correction code using both the second data and the information on the first error correction code. Using the information on the first error correction code as well as the second data in order to provide information on the second error correction code results in an interdependency of the error code generation processes for the first and the second data. Therefore, one may discover failures during both, the first error code generation and the second error code generation using the joint error correction code without being required to transmit a separate error correction code for both of the data.

According to some embodiments, an apparatus for providing a joint error correction code for a combined data frame comprising first data of a first data channel and second data of a second data channel comprises a first error code generator as well as a second error code generator. The first error code generator is configured to provide, based on a linear code, information on a first error correction code using the first data and the second error code generator is configured to provide, based on the linear code, information on a second error correction code using the second data. The apparatus is configured to provide the joint error correction code using the information on the first error correction code and the information on the second error correction code. In using both error code generators and creating the joint error correction code using the information on the first error correction code and the information on the second error correction code, a dependency of the joint error correction code on both the first and the second error code generators is generated. Hence, a diagnostic coverage may be increased in that the first error code generator as well as the second error code generator may be discovered to be inoperational as compared to an approach using only one of the first code generator or the second code generator on a combination of the first data and second data, which would result with a malfunction of at least one error generator being indiscoverable. At the same time, the amount of data being used for the transmission of the joint error correction code may remain at a moderate level, for example being equivalent to the amount of data required for separate transmission of a single one of the first data channel and the second data channel.

According to some embodiments, a sensor system comprises a first sensor providing first data, a second sensor providing second data, as well as an apparatus for providing a joint error correction code for a combined data frame. Such a sensor system may be capable of transmitting the first data of the first sensor as well as the second data of the second sensor in a secured mode allowing to detect a corruption of data during its transmission as well as during processing by the individual error code generators. This may allow to providing a sensor system being functionally safe and having a diagnostic coverage allowing to detect irregularities within the whole processing chain up to a receiver of the combined data frame. For example, if both sensors are configured to provide data indicative of the same physical quantity, a sensor system may be provided which allows to reliably determine the sensed physical quantity on receiver side. The physical quantity itself is sensed redundantly and the processing and communication channels up to the receiver are appropriately secured to enable the receiver to become aware of any irregularity within the processing and the communication channels.

BRIEF DESCRIPTION OF THE FIGURES

Some embodiments of apparatuses and/or methods will be described in the following by way of example only, and with reference to the accompanying figures, in which FIG. 1 schematically illustrates an embodiment of an apparatus for providing an joint error correction code for a combined data frame comprising first data of a first data channel and second data of a second data channel.

DETAILED DESCRIPTION

While further embodiments may be capable of various modifications and alternative forms, some example embodiments thereof are shown by way of example in the accompanying figures and will subsequently be described in greater detail. It should be understood, however, that there is no intent to limit example embodiments to the particular forms disclosed. On the contrary, example embodiments are to cover all modifications, equivalents, and alternatives falling within the scope of the disclosure. In the figures and their description, like reference numbers refer to like or similar elements. Further, the thicknesses of lines, layers and/or regions may be exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting for further example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/ or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art, unless expressly defined otherwise herein.

Figure 1:
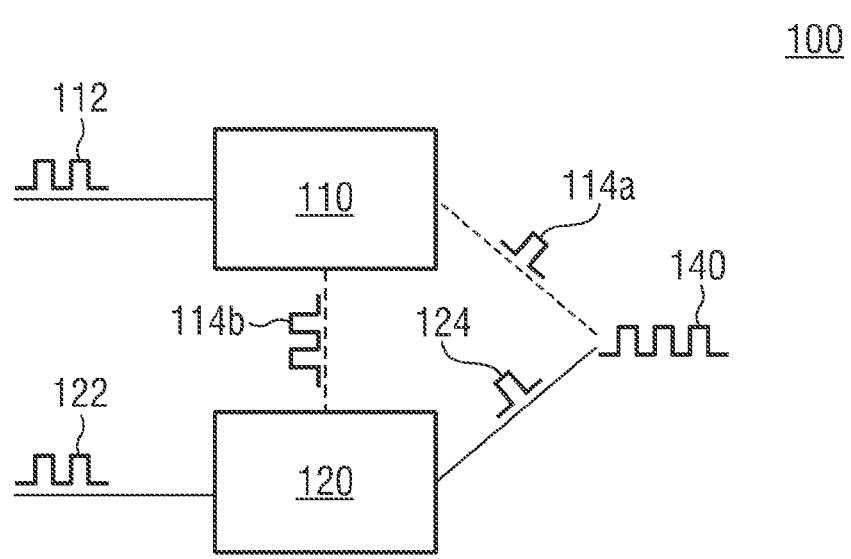

FIG. 1 schematically illustrates an embodiment of an apparatus for providing a joint error correction code for a combined data frame which comprises first data of a first data channel and second data of a second data channel. The joint error correction code provided by the apparatus protects or covers the first data emanating from a first data channel as well as the second data emanating from the second data channel. That is, a corruption of any of the first data or the second data during a transmission over a common data channel within a combined data frame can be discovered by means of the joint error correction code generated by the apparatus of FIG. 1. Generally, an error correction code is redundant information generated from the data to be protected, i.e., the first data and the second data. When, e.g., the generated joint error correction code is combined with the first data and the second data into a combined data frame, corruption of the data, e.g. single or multiple bit flips during the transmission of the data can be discovered on the receiving side. This may be achieved in that the received joint error correction code is compared with the received data for which the joint error correction code has been generated on the sender side. If the data or the joint error correction code has been altered during the transmission, the comparison of both at the receiver side provides an inconsistency, hence allowing to conclude that the data or the joint error correction code have been changed.

The embodiments of the present disclosure allow for an efficient implementation for providing a joint error correction code for first data of a first data channel and the second data of a second data channel, additionally providing for coverage of possible hardware faults within components associated to the data channels.

To this end, the apparatus 100 for providing an joint error correction code 140 comprises a first error code generator 110 configured to provide, based on a linear code, information on a first error correction code 114a or 114b using the first data 112. A second error code generator 120 is configured to provide, based on the linear code, information on a second error correction code 124 using the second data 122. The apparatus 100 is configured to provide the joint error correction code 140 using the information on the first error correction code 114a or 114b and the information on the second error correction code 124.

According to the embodiment of FIG. 1, the first data 112 of the first data channel and the second data 122 of the second data channel are processed by independent error code generators 110 and 120, i.e. by independent hardware entities. However, the information generated by the independent error code generators 110 and 120 is combined or interrelated in that the resulting joint error correction code 140 is created using both, results generated by the first error code generator 110 and the second error code generator 120. This may, for example, increase a diagnostic coverage to cover possible faults of either one of the first error code generator 110 or the second error code generator 120 as compared to implementations where only one of the first error code generator 110 and the second error code generator 120 is used to process both data together.

In using both of the error code generators 110 and 120, a fault in each of the error generators can be diagnosed, which may be of particular interest when data of first and second data channels is to be jointly transmitted in an application where each data channel already comprises a processing chain exhibiting error correction capabilities and associated error correctors. In this event it may be important to reliably diagnose software and hardware failures within each of the processing chains or simply discard the data of the sensor and bring the system that would use it into a safe state. Since a failure within the error code generator of each of the processing chains may be indicative of further failures within the associated processing chain, it may be of importance to be able to be sensitive to malfunctions within each of the error code generators 110 and 120 also as an indicator that further components within the associated processing chain may be malfunctioning. In this event, data of the associated processing chain might not be relied on.

This may be particularly important in systems requiring functional safety of their components, such as for example in systems being compliant with the Automotive Safety Integrity Level standard (ASIL, ISO 26262), in particular to the presently most demanding category of the standard, ASIL-D. In those applications, it may be important to be aware of any possible hard- or software failure in order to enable subsequent devices to enter into a functionally safe state where they do not necessarily rely on the information coming from the data channels any longer. One particular example may be automotive applications where electronic control units (ECUs) or other circuitry rely on sensor data in order to assist the driver. One particular example, may, for example, be force or strain sensors sensing a steering torque and used to calculate a power provided by a power steering system. Another example may be sensors sensing a magnetic field used to determine a rotational speed of a wheel which is one of the vital input quantities for an ECU controlling vehicle stability or anti-lock braking systems. In both of those examples, it is preferable to enter a functionally safe state not relying on possibly corrupt sensor inputs to avoid miscalculations which may result in a possible injury of a driver of the vehicle due to, e.g., blocking wheels or a malfunctioning power steering system.

The use of a linear code to determine information on the joint error correction code for both the first data and the second data enables the combination of the information of the first error code generator and the second error code generator due to the inherent properties of a linear code. The resulting joint error correction code is valid for both the first data and the second data within the combined frame. That is, the resulting joint error correction code equals an error correction code generated using the combined frame as an input for the generation of the linear code, despite the fact that two distinct error code generators contributed to the generation of the joint error correction code. This is enabled due to the fact that the application of the linear code C to data X, Y and Z follows the linearity criterion expressed by $C(X \oplus Y \oplus Z) = C(X) \oplus C(Y) \oplus C(Z)$, with the operator $\oplus$ denoting an X-OR combination. That is, the generation of the code for an X-OR combination of first data X and second data Y is equal to the X-OR combination of the code for the first data X and the code for the second data Y. The used linear code can be chosen to suit one's need, in particular with respect to the number of redundancy required for the particular implementation, i.e., the length or amount of data consumed by the joint error correction code can be deliberately chosen for the particular requirement. For example, for a subsequent communication link carrying the combined data frame which is known to be sensitive to distortion, an increased length of the joint error correction code may be chosen. Likewise, if a detection of a malfunction of a hard- or software within the first communication channel or the second communication channel is the main focus, the length or a joint error correction code might be chosen lower.

For example, if the error code generators generically associated with the first and second data channels provide a given length (number of bits) N of the error correction code, an apparatus for providing an joint error correction code may be configured to combine the information on the error correction codes determined by both error code generators separately to result with an joint error correction code having a length of N as well. This may reduce the amount of data within the combined data frame to be transmitted over a subsequent communication channel as compared to a purely multiplexed approach. In the multiplexed approach, a first error correction code for the first data is generated by the first error code generator 110 and a second error code is generated for the second data 122 by the second error code generator 120 separately before the first data, the first error correction code, the second data and the second error correction code are multiplexed into a combined data frame. In particular, as compared to this approach, the number of bits or the amount of data associated to a single error correction code generated by one of the first error code generator 110 and the second error code generator 120 may be saved, thus increasing efficiency of the data transmission.

On the other hand, if the joint error correction code is required to be stronger, the apparatus may be designed to provide a joint error correction code having twice the length of the error correction code originally provided by either one of the first communication channel and the second communication channel. This increases safety or coverage since that a longer error correction code is capable of detecting a larger number of fault scenarios, e.g. a larger number of bit flips within a combined data frame having the first data and the second data. In particular, as compared to the previously described multiplexing approach, the number of bits to be transmitted would be equal while the number of failures to be detectable is greatly increased. In other words, a joint error correction code having 2M bits of error correction code for 2N bits of data is capable of covering more error scenarios than an error code of length M representing or covering data of length N used twice in order to transmit the identical amount of data of 2N bits.

The particular type of linear code is not restricted among the class of linear codes. For example, a Hamming-Code, a Low-Density-Parity-Check-Code, a Reed-Muller-Code, a Hadamard-Code or a cyclic code (CRC) may be used.

While the previous considerations are valid for all linear codes, an apparatus for providing a joint error correction code may be configured to provide the joint error correction code 140 by combining information on the first error correction code and information on the second error correction code in multiple ways, depending on the type of joint error correction code used. The linearity of the code allows determining a first error correction code for a first data frame including the first data and a second error correction code for a second data frame including the second data independently before combining the first error correction code and the second error correction code to provide the joint error correction code 140. This possibility is indicated by means of a first alternative way to use an information on the first error correction code 114a in FIG. 1, resulting in the joint error correction code 140 for the combined data frame. Particular implementations following this approach will subsequently be described with respect to FIGS. 2, 4 and 6.

For particular codes, however, there also exists the possibility to not provide a complete error correction code for one of the first data or the second data but to use other information on a first error correction code 114b instead, which may be an intermediate result in the generation of the error correction code for one of the first data or the second data to initialize the code generator of the other one of the first data or the second data. For example, information on the first error correction code 114b generated by the first error code generator 110 using the first data 112 may be used to initialize or as an additional input of the second error code generator 120, as indicated by the second alternative use of an information on the first error correction code 114b in FIG. 1. For example, when a cyclic code is used, which may be efficiently implemented in hardware, an intermediate result of the calculation of an error correction code may be used as an information on the first error correction code 114b to initialize the second error code generator 120. One particular embodiment using information of the first error code generator 110 to initialize the second error code generator 120 will subsequently be described with respect to FIG. 7.

In the following Figures, embodiments of methods and apparatuses for providing a joint error correction code for a combined data frame comprising data of a first data channel and of a second data channel are mainly described in an application within a sensor system having two sensors for a physical quantity which generate the first data and the second data. That is, a first sensor serves as a generator or provider of the first data of the first data channel while a second sensor serves as a provider for the second data of the second data channel. Further embodiments may, of course, also use different generators or sources of data to be combined into a combined data frame or to be protected by means of a joint error correction code for the combined data frame. That is, FIG. 2 illustrates Sensor system, comprising: a first sensor circuit providing first data 216 a second sensor circuit providing second data 226 and an apparatus 200 for providing an joint error correction code for a combined data frame.

Figure 2:
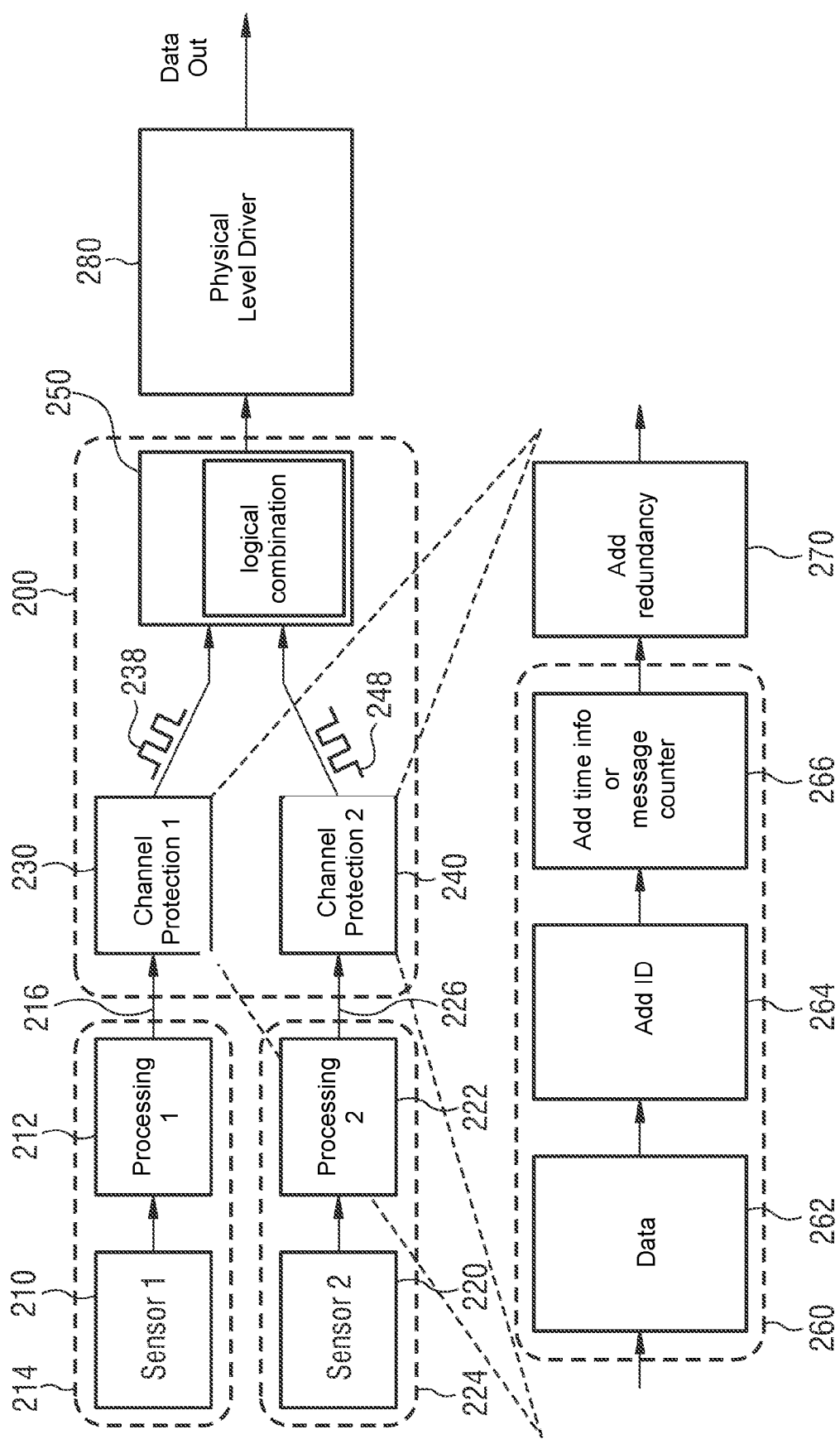
FIG. 2 illustrates a further embodiment of an apparatus for providing a joint error correction code using a first error correction code for the data of a first data channel and a second error correction code for the data of a second data channel.

In the embodiment illustrated in FIG. 2, data generated by a first sensor 210 and a second sensor 220 are combined and supplemented with a joint error correction code for a combined data frame to be transmitted over a single communication channel. As a supplement for the complete communication channel, a physical level driver 280 is illustrated in FIG. 2, the physical layer driver 280 being used to transform the combined data frame to be transmitted over the physical medium into the appropriate physical signal. The medium may, for example, be a wireline or a wireless communication link.

In the embodiment illustrated in FIG. 2, the data being indicative of a sensed physical quantity is further processed by means of processing devices 212 and 222, respectively. For example, the processing may comprise an analog-to-digital conversion of an analog sensor signal and some further processing of the digitized signal, such as, for example, averaging or applying corrections caused by previous sensor calibrations or the like. To this end, the sensors 210 and 220 and their associated signal processing 212 and 222 may be viewed as a source of data or a data channel each. In other words, the combination of the sensor 210 and the associated signal processing 212 forms a first data channel 214. Likewise, the sensor 220 and its associated signal processing 222 forms a second data channel. The data of the two data channels is combined in at least one combined data frame or in a series of combined data frames for which a joint error correction code is to be derived. To this end, the first data 216 of the first data channel 214 is provided to the first error code generator 230 and the second data 226 of the second data channel 224 is provided to the second error code generator 240.

Figure 3:
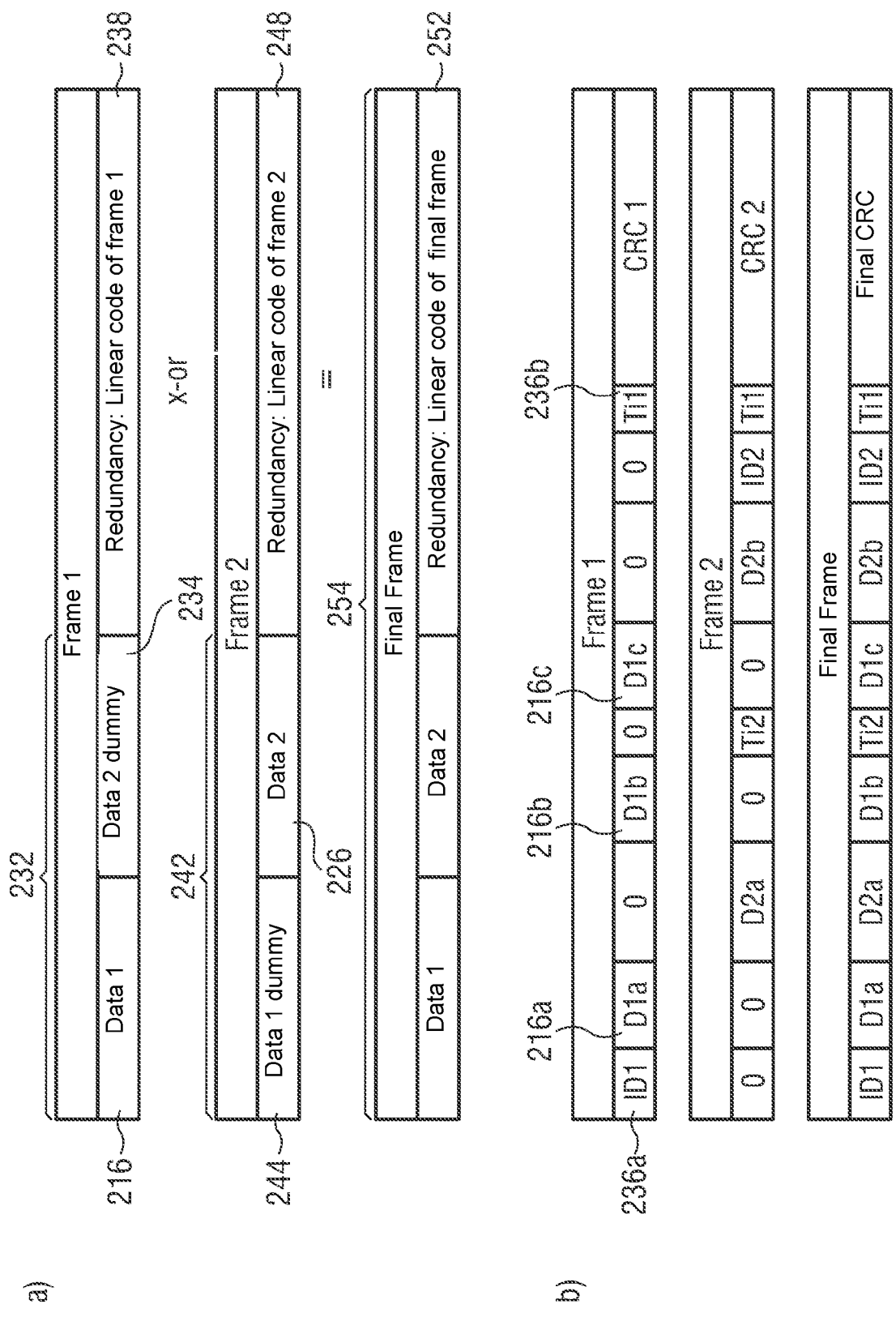
FIG. 3 illustrates two examples for combined data frames as generated by an example of an apparatus or a method for providing a joint error correction code.

In the embodiment of FIG. 2, a first error correction code 238 is provided for a first data frame comprising the first data by means of the first error code generator 230 and a second error correction code 248 is provided for a second data frame comprising the second data independently by means of the second error code generator 240. Despite its independent generation, the linearity of the code allows to combine the first error correction code 238 and the second error correction code 248 after their generation to provide the joint error correction code for a combined data frame provided that the first data frame and the second data frame are generated appropriately. FIGS. 3a and 3b illustrate two examples as to how first and second data frames may be provided by means of, for example, data frame assemblers within the error code generators 230 and 240 in order to allow independent generation of an error correction code within both the first data channel 214 and the second data channel 224.

Since both data frames are provided using a similar approach, the following discussion focuses on FIG. 3a, illustrating the generation of the first data frame 232 and the second data frame 242. To provide the data frames, the error code generators 230 and 240 each comprise a data frame assembler which is configured to provide the first data frame 232 and the second data frame 242, respectively. The first data frame comprises the first data 216 as well as first dummy data 234 corresponding to the second data 226. Likewise, the second data frame 242 comprises the second data 226 as well as second dummy data 244 which corresponds to the first data 216. The first and second data frames 232 and 242 have an identical frame length which is determined by the sum of the lengths of the first data and the second data. For example, the number of bits within the first and second data frames equals the sum of the number of bits of the first data 216 and the second data 226.

The first data 216 occupies a first set of positions within the first data frame 232. The identical positions within the second data frame 242 are occupied by the second dummy data 244. To this end, the first dummy data 234 within the first data frame 232 corresponds to the second data 226 in that the first dummy data 234 within the first data frame 232 is distributed to the precisely same positions within the first data frame 232 which are occupied by the second data 226 within the second data frame 242. In other words, the first data frame 232 is provided by distributing data bits of the first data 216 to a first set of positions within the first data frame 232 and by distributing predetermined data bits as the first dummy 216 data to the remaining second set of positions within the first data frame 232. Likewise, the data bits of the second data 226 are distributed to the second set of positions within the second data frame 242 while the remaining first set of positions within the second data frame 242 is filled with the dummy data. One particular choice for dummy data would be to set all the bits of the dummy data equal to zero in a binary system. Likewise, the dummy data could all be set to unity or a predetermined pattern of zeros and ones may be used as a dummy data instead. Further, while the example in FIG. 3a illustrates a particular choice for the distribution of the first data 216 and the second data 226 in that those are each forming a continuous block of data, further embodiments may readily use up an arbitrary set of positions within each of the data frames for the first data and the second data, respectively, while the rest of the positions is filled with dummy data. Another example using a different set of positions for the first data 216, splitting up the first data 216 to form 3 independent blocks 216a, 216b and 216c is illustrated in FIG. 3b and elaborated on in one of the subsequent paragraphs. Further, the embodiment illustrated in FIG. 3a illustrates a particular implementation where the first data 216 and the second data 226 are provided with an equal length. Further embodiments, however, may combine first and second data having different lengths, the ratio of the lengths of the first and the second data being arbitrary.

As illustrated in FIG. 2, the data frame assembly within the first error code generator 230 and the second error code generator 240 is performed by means of an appropriate algorithm or a data frame assembler. In the embodiment illustrated in FIG. 2, additional data may optionally be appended to the data as provided by the first and second data channels. In particular, an ID code and a timer information or a message counter may be added to each of the first data frame and the second data frame or even to each data packet of the first data and the second data in case the first data is subdivided into multiple data packets. Such an example is illustrated in FIG. 3b, showing the first data 216 subdivided into multiple data blocks 216a, 216b and 216c, supplemented by a data identification (data ID1) 236a as well as corresponding timer information 236b (T1). It is to be understood that this additional data is just one particular example and further embodiments may completely omit the application of additional data, as illustrated in FIG. 3a, or append different data to the first data and the second data. Irrespective of the appending of additional data, the data frame generator within each of the first error code generator 230 and the second error code generator 240 provides the first data frame 232 and the second data frame 234 such that the data frames have equal lengths and the payload data to be transmitted over a communication channel is distributed within the first data frame such that the identical positions within the second data frame are filled with dummy data and vice-versa.

Since the layout of the data frame assemblers of the particular example illustrated in FIG. 2 is identical for each of the error code generators 230 and 240, only one instance of a data frame assembler 260 is illustrated in FIG. 2. The data frame assembler 260 comprises a data reception unit 262 configured to receive the data of a data channel. Further, the data frame assembler comprises an optional ID generator 264 configured to append a data ID 236a to the received data as well as a timer information generator 266 configured to add timer information 236b to the received data. The data frame assembler 260 is configured to provide the data frame according to the previously described rules, treating optionally added data of the ID generator 264 and the timer information generator 266 like data from the data received from one of the data channels. After the generation of the data frame, an error code determiner 270 within the error code generators 230 and 240 is configured to provide an error correction code for the associated data frame using a linear code. As illustrated in FIG. 3a, the first error code determiner of the first error code generator 230 generates a first error correction code 238 for the first data frame 232 and the second error code determiner of the second error code generator 240 generates the second error correction code 248 for the second data frame 242.

Using the first error correction code 238 and the second error correction code 248, a code combiner 250 of the apparatus 200 is configured to combine the first error correction code 238 and the second error correction code 248 to provide the joint error correction code 252 which allows to detect a corruption of the first data 216 or the second data 226 within the combined data frame 254. In the embodiment of FIG. 2, the joint error correction code 252 is determined by an X-OR combination of the first error code 238 and the second error code 248 resulting in an joint error correction code protecting the first and the second data alike, due to the inherent properties of a linear code. Moreover, the combined data frame 254 is also generated by an X-OR combination of the first data frame 232 and the second data frame 242.

In particular, due to the choice of the dummy data bits being zero, the unaltered data bits of the first data 216 and the data bits of the second data 226 are contained within the combined data frame 254. However, a similar combination of the first data frame 232 and the second data frame 242 is also be possible if, for example, their dummy data was chosen to be only ones resulting in a combined data frame having an inverted content.

In other words, FIG. 2 illustrates an embodiment where the data fields of the opposite channel are filled with dummy data (e.g. all zero). The redundancy or error correction code is added in each channel independently by generation of a linear code, e.g. a cyclic redundancy check (CRC), a Hamming code or a low-density parity check code (LDPC). The generation of the redundancy includes the dummy data of the opposite channel. That is, messages are generated as complete frames in each of the channels or in each of the error code generators and the protection is added independently in every channel in a way that the two frames are combined by logical (for example X-OR) combination. As illustrated in FIG. 3b, the data of each channel may furthermore be distributed over multiple packages within a combined data frame and the same may be done with an optional identification number (ID), timer or frame counter data of each channel if appropriate and applicable. Furthermore, also the joint error correction code may, like the payload data in FIG. 3b, be distributed over the combined data frame instead of being appended to the end of the frame, which is, for example, usual for an ordinary hamming code.

Figure 4:
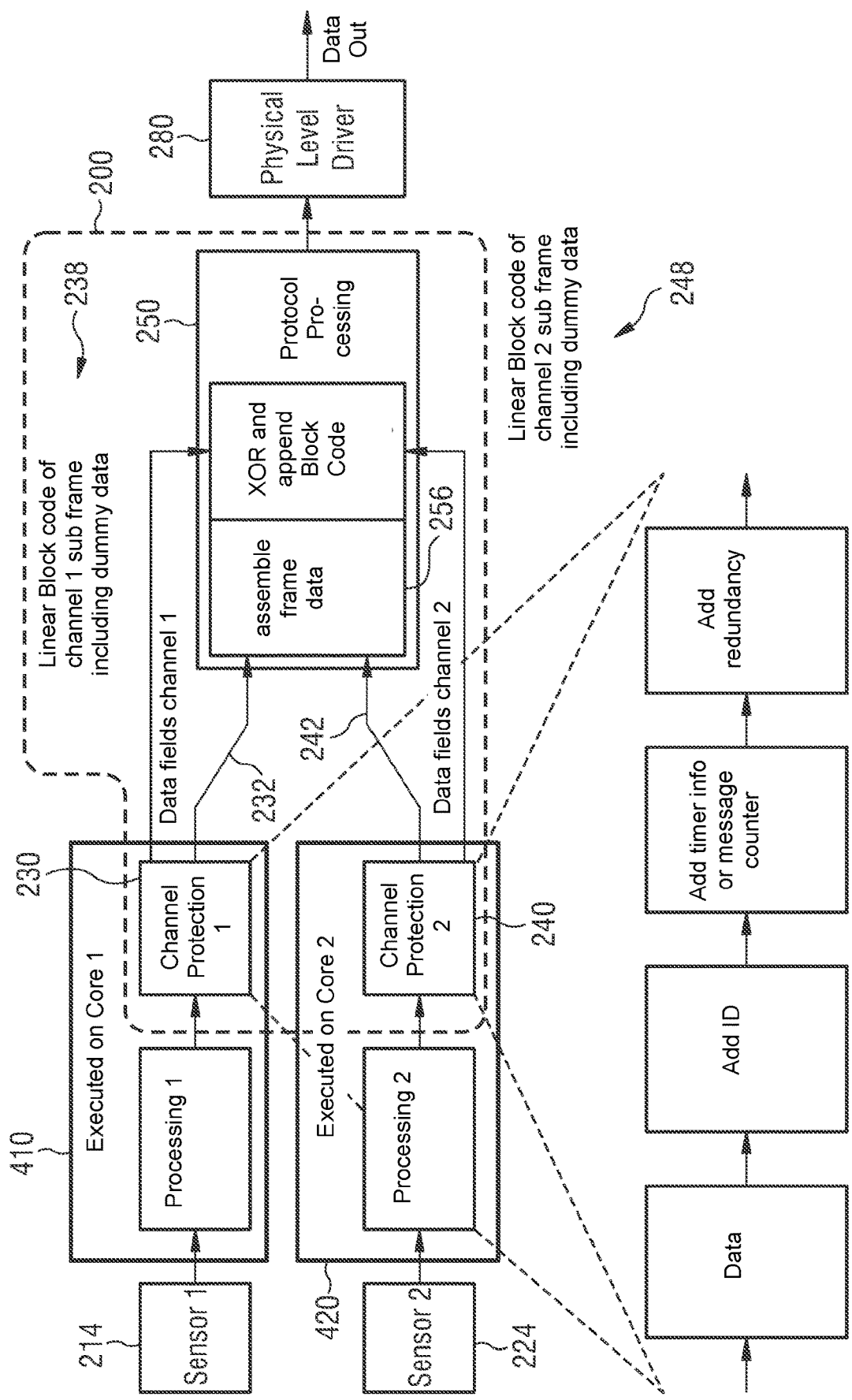
FIG. 4 illustrates a further example of an apparatus for providing a joint error correction code using an alternative way to generate a combined data frame.
Figure 5:
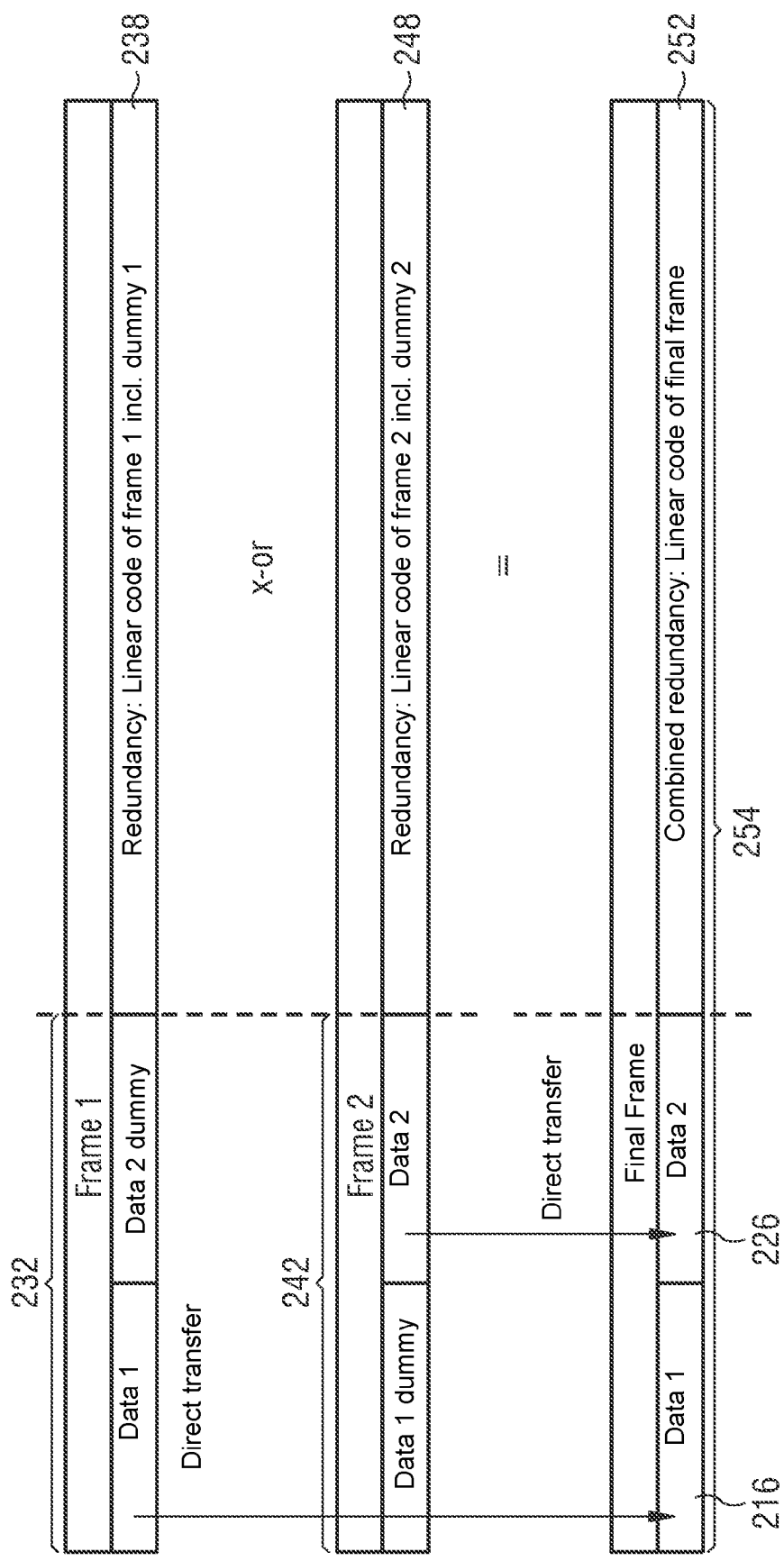
FIG. 5 illustrates an example of a combined data frame generated according to the embodiment illustrated in FIG. 4.

The embodiment illustrated in FIGS. 4 and 5 is based on the same principles as the embodiment illustrated in FIG. 2 and reference is herewith made to FIG. 2 with respect to the explanation of the common principles. However, the embodiment illustrated in FIGS. 4 and 5 differs from the embodiment of FIG. 2 in the way the combined data frame 254 is generated or assembled by means of the code combiner 250. The combination of the first error correction code 238 and the second error correction code 248 to provide the error correction code 252 for the combined data frame 254, however, is like the one discussed with respect to FIG. 2. Other than in the embodiment illustrated in FIGS. 2 and 3, the first data frame 232 and the second data frame 242 are generated only for the generation of the first error correction code 238 and the second error correction code 248. Like in the embodiment of FIG. 2, the joint error correction code 252 for the combined data frame 254 is determined by combining the first error correction code 238 and the second error correction code 248 using X-OR logic, as illustrated in FIG. 5. To this end, the first error correction code 238 and the second error correction code 248 are provided to the code combiner 250 independently from the first data 216 and the second data 226 which are forwarded to the code combiner 250 in parallel to the error correction codes 238 and 248. Instead of performing an X-OR combination of the first data frame 232 and the second data frame 242, the code combiner 250 of the embodiment of FIG. 4 fills the first set of positions within the combined data frame 254 with the first data 216, the second set of positions within the combined data frame 254 with the second data 226 and distributes the data bits of the joint error correction code 252 to the remaining positions within the combined data frame. As already mentioned before, the positions where the first data, the second data and the joint error correction code data reside within the combined data frame 254 are arbitrary and, only for the simplicity of illustration shown to be subsequent blocks occupied by a single type of data each in FIG. 5.

In order to implement the embodiment of FIG. 4 efficiently, a combined frame generation register 256 may be present within the code combiner 250 which is configured to receive the first data only at a first set of positions within the combined data frame 254, and the second data only at a second set of positions within the combined data frame 254. The first error code generator 230 may so only be able to access the positions within the register foreseen to carry the first data 216 and, likewise, the second error code generator 240 may only be able to access the positions within the combined frame generation register 256 foreseen to carry the second data 226 in the combined data frame 254. This may additionally serve to avoid failures in the generation of the combined frame in that a misdistribution of data is not possible.

In other words, in the embodiment illustrated in FIG. 4, each channel or error code generator writes its data packages directly into an combined frame generation register 256 where it only has access to the relevant positions in the frame and the dummy data is only used for the internal block code calculations of the sub-frames, i.e. of the first data frame and the second data frame. Both channels, e.g. their error code generators hand over the code or data to the code combiner 250 (protocol generator) and the code combiner performs the X-OR combination of both error correction codes (block codes) before adding it to the final frame. This implementation may avoid faults that may be introduced by using wrong dummy data during the calculation of the first and second error correction codes and forward them into the final frame by using them in the X-OR operation again.

As further illustrated in FIG. 4, the first error code generator 230 is implemented in a first processing core 410, while the second error code generator is implemented within a second, different processing core 420. When both error code generators are executed on different processing cores, CPUs, hardware components or the like, the independent generation of an error protection code for the first data and the second data and the subsequent generation of a transmitted joint error correction code as disclosed herein may allow to also cover hardware failures within each of the individual cores. When a hardware failure in one of the processing cores 410 or 420 occurs, the combined error code received by, e.g., a ECU, will not represent the received combined error frame so that the receiver side can detect that the received data should not be relied on.

The combination of the first data frame and the second data frame into a combined data frame and the combination of the first error correction code and the second error correction code may not necessarily be performed within a separate hardware entity, as suggested by the illustration of the code combiner 250 in FIGS. 2 and 4. Similarly, the combination of the data frames and the joint error correction code may be executed within a computing entity associated to one of the data channels once the protection by means of the error correction codes was already derived independently. Any fault introduced during the combination will result in a combined data frame and associated joint error correction code that allows detecting the fault within the final combined data frame with a probability depending only on the strength of the used code.

The combination of the first error correction code 238 and the second error correction code 248 may be performed on either of the processing cores 410 or 420 without any loss of diagnostic coverage or error correction capability once the generation of the error correction codes 238 and 240 has already been provided independently from one another. Just as an example, FIG. 6 illustrates an embodiment where the code combiner 250 is implemented within the second processing core.

Figure 6:
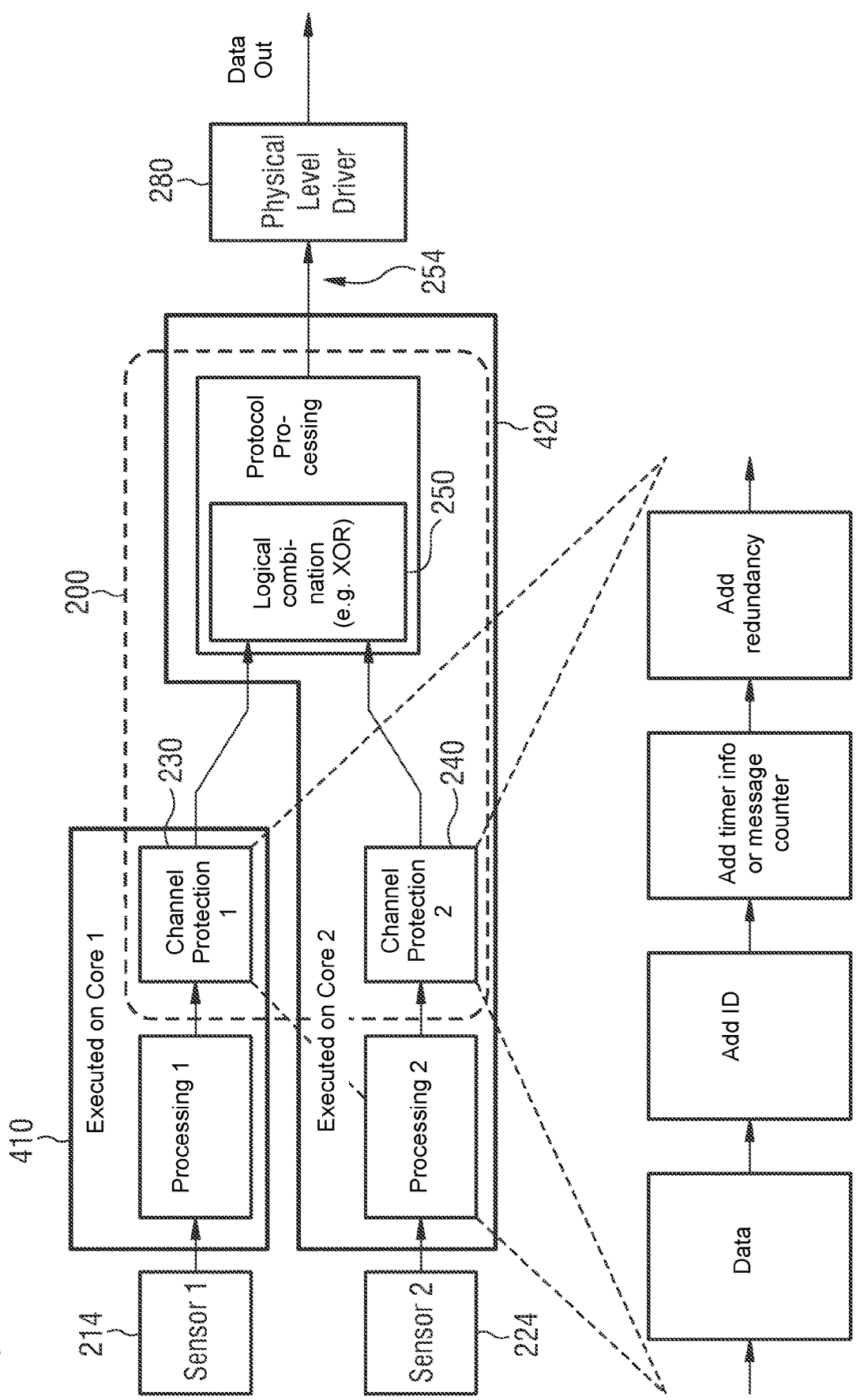
FIG. 6 illustrates a further example of an apparatus for providing a joint error correction code using different processing cores.
Figure 7:
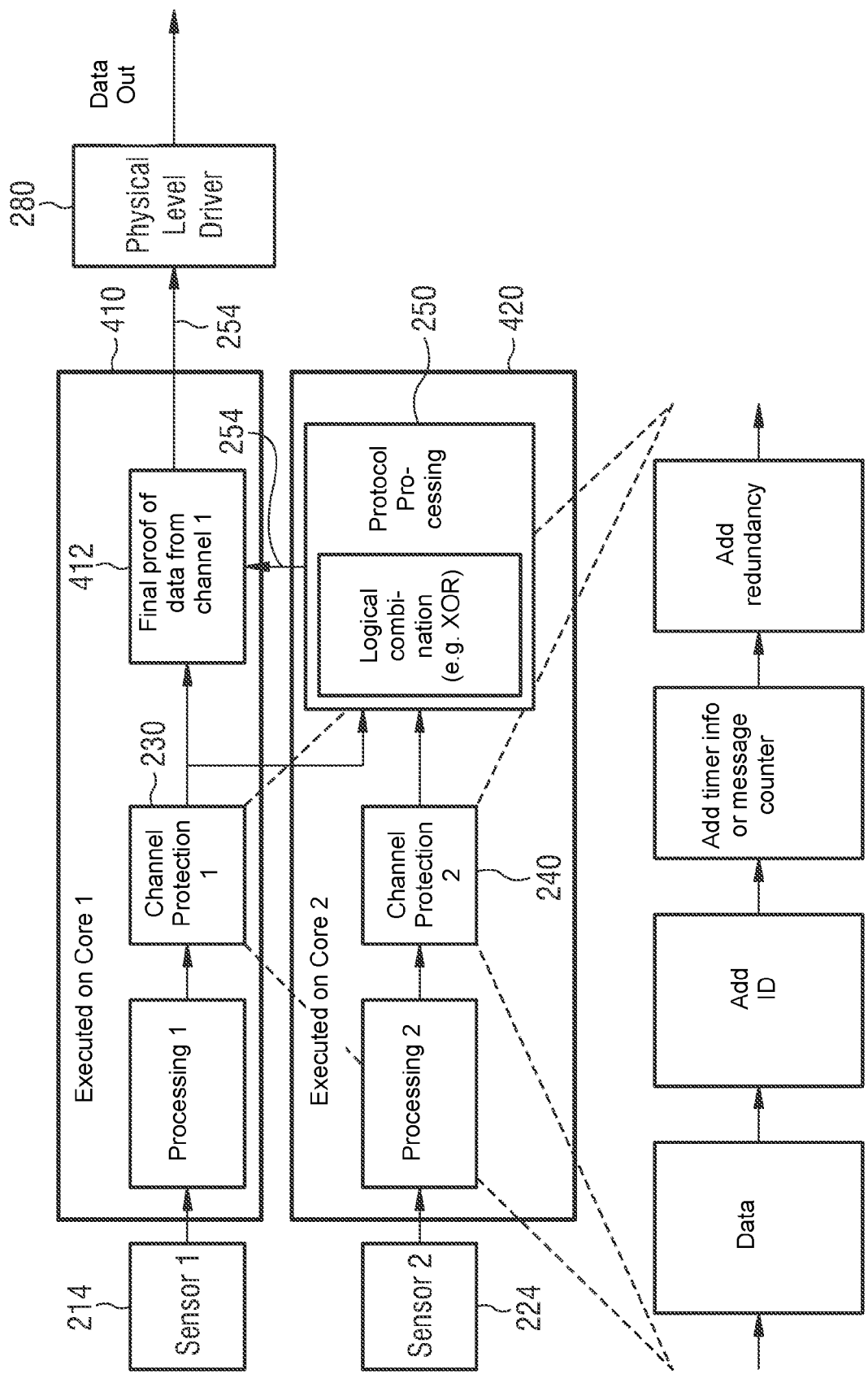
FIG. 7 illustrates a further embodiment of an apparatus for providing a joint error correction code further comprising a plausibility check, whether the joint error correction code is validly generated.

FIG. 7 illustrates a further embodiment based on the same principles and similar to the embodiment of FIGS. 4 and 6. Similar to the embodiment of FIG. 6, the apparatus is configured to generate the combined data frame on the second processing core 420, i.e., the code combiner 250 is implemented within the second processing core 420. After generation of the combined data frame, the combined data frame is transferred to the first processing core 410 (the other channel) to check, whether its data has not been modified during the assembly or the generation of the combined data frame. To this end, the first processing core 410 may comprise an evaluator 412 which may, for example, check whether the combined data frame 254 and its associated error code correspond to each other using the same computations performed by a receiver or a subsequent ECU. Such a re-check may improve the fault coverage and also the availability of the correct data in the event that the subsequent system using the submitted data of the combined data frame cannot switch into a safe operational state, even if wrong messages or corrupt combined data frames have been detected.

Figure 8:
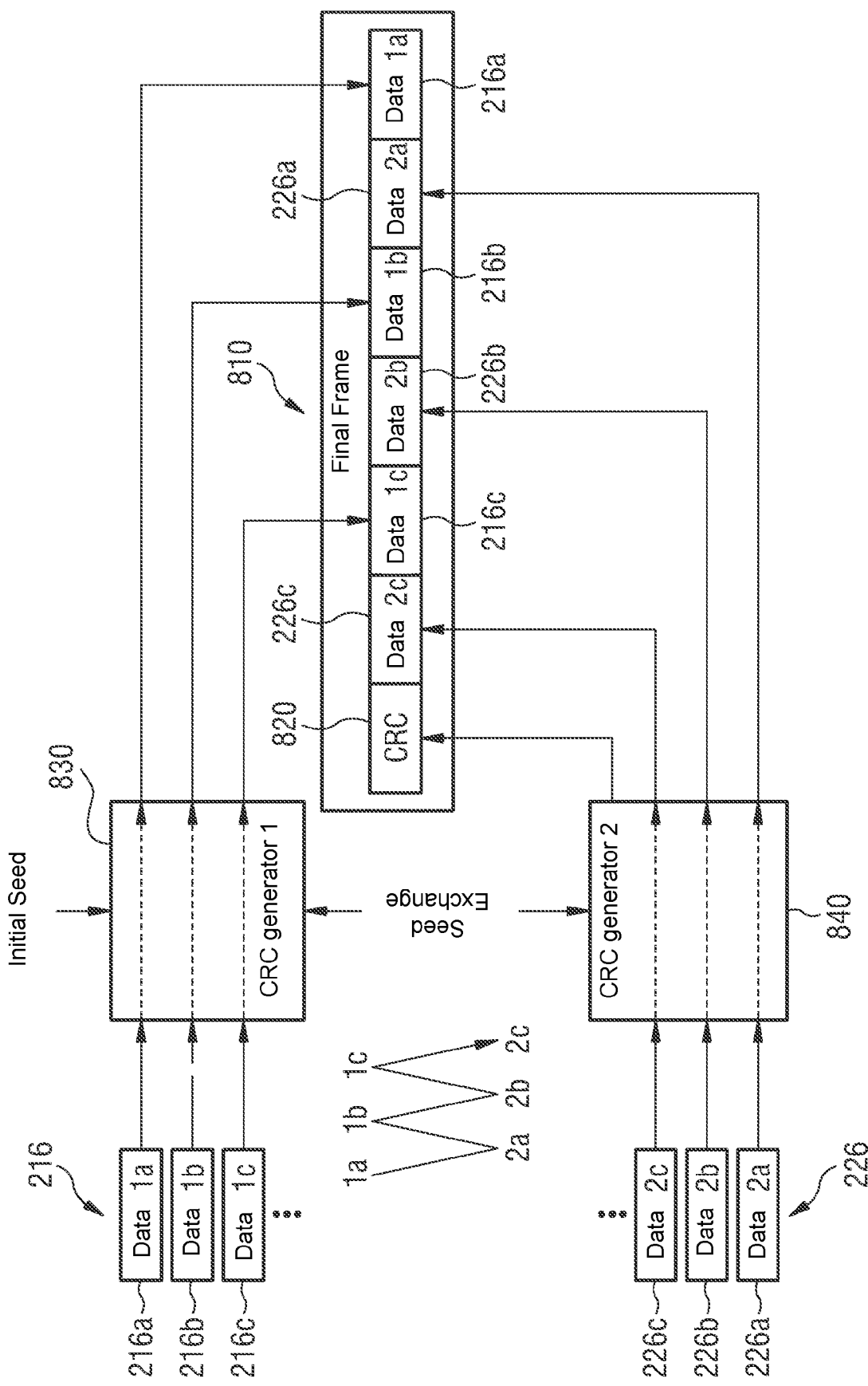
FIG. 8 illustrates a further embodiment of an apparatus for generating a joint error correction code using a cyclic redundancy code.

FIG. 8 illustrates an example of the generation of a joint error correction code for a combined data frame 810 using a cyclic code which is a particular type of a linear code. A cyclic code is characterized by a generator polynomial which becomes the divisor in a polynomial division taking the data to be protected as the dividend. The remainder of the polynomial division becomes the result, i.e., the error correction code produced by the cyclic error correcting code. Due to their generation, cyclic codes exhibit some inherent properties, allowing for efficient hardware implementations. In particular, a cyclic redundancy code (CRC) or any cyclic code can be created by sequential processing of the bits of an input data stream by means of a series of registers concatenated or coupled to one another using X-OR gates.

Figure 9:
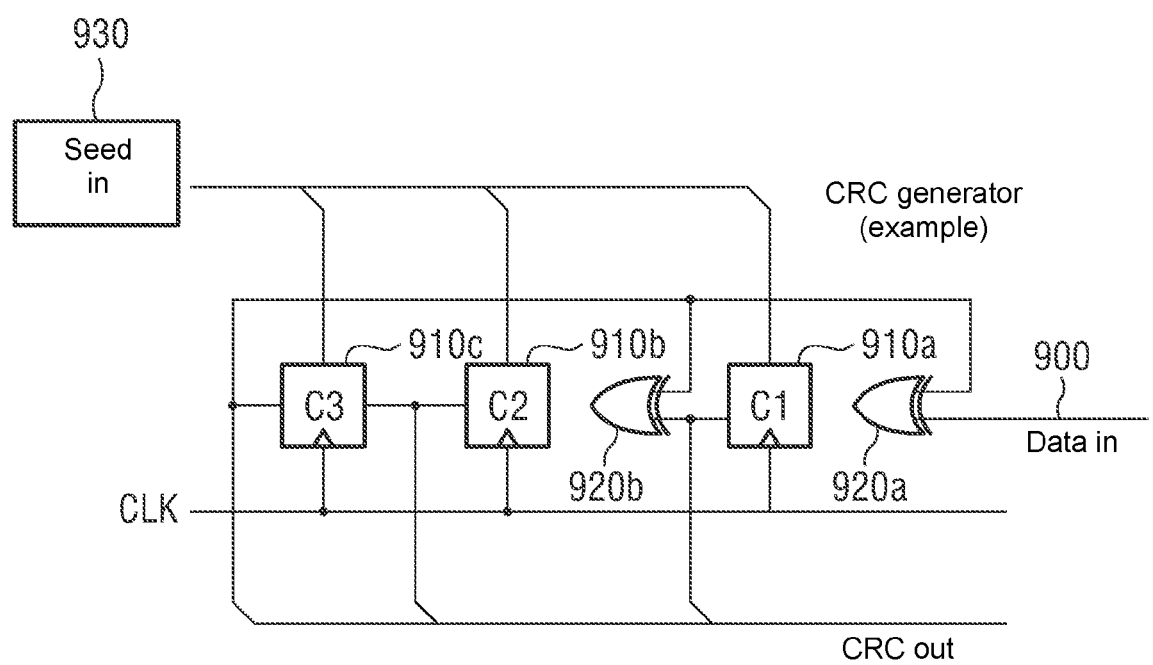
FIG. 9 illustrates an implementation of a cyclic redundancy code generator.

Using a cyclic code also allows for a particularly efficient implementation of an apparatus for providing a joint error correction code, as illustrated in FIGS. 8 and 9. FIG. 9 illustrates the generation of a cyclic code having three bits (CRC-3) by means of an error code determining circuit. As already mentioned, an error correction code based on a cyclic code can be determined by sequentially processing the data bits of a data frame using a set of registers, as illustrated in FIG. 9. When the last bit of the data has been processed, the registers of the error code determining circuit hold the error correction code. FIG. 9 illustrates an example for such a hardware implementation, having a data input 900 for sequentially receiving the data bits to be processed and a series of registers 910a, 910b and 910c. The registers are either directly connected or X-OR gates may be present in between, depending on the particular cyclic code used. In the example of FIG. 9, the data input 900 is connected to a first input of a first X-OR gate 920a having its output coupled to the first register 910a and its second input coupled to an output of the third register 910c. The output of the first register 910a is coupled to an input of a second X-OR gate 920b having its second input coupled to an output of the third register 910c. The output of the second X-OR gate 920b is coupled to an input of the second register 910b and the output of the second register 910b is coupled to an input of the third register 910c. After each processing step, the error correction code or the cyclic error correction code corresponding to the data processed so far is present at an output of the three registers 910a to 910c. The error code determiner illustrated in FIG. 9 further provides for the possibility to preload the registers 910a to 910c with arbitrary values provided by means of an initialization input 930 (seed-value input). Initializing values (seed values) are sometimes used for cyclic error correction codes in order to start with the computation from a known configuration of the registers in order to avoid ambiguities, for example, the so-called zero-problem.

When a cyclic code is used as a linear code within an apparatus for providing a joint error correction code for a combined data frame as discussed herein, a particularly efficient way of code generation may be chosen, as illustrated in FIG. 8. FIG. 8 illustrates cyclic code generators 830 and 840 being the error code generators used. Like the embodiment illustrated by means of FIGS. 2 and 3b, the data to be protected may be subdivided into a series of data packets. In the particular illustration of FIG. 8, the data of the first data channel 216 is divided into a series of data packets 216a to 216c and so is the second data 226 of the second data channel. According to the embodiment illustrated in FIG. 8, the first data packet 216a is processed by the first error code generator 830 having, at the end of the processing of the first data packet 216, an error correction code representing the first data packet stored in its registers, that is, after the processing of the first data packet 216, the first error code generator 830 holds information on a first error correction code which is derived based on the first data 216.

Having completely processed the first data packet 216a, the first data packet is transferred into the combined data frame 810, as illustrated in FIG. 8. The first data packet 226a of the second data 226 is provided as the second data packet within the combined data frame 810 and the processing of the joint error correction code should proceed in a way that the resultant joint error correction code is valid for the series of data formed by the first data packet 216a of the first data 216 and the second data packet 226 of the second data 226.

This is achieved by initializing the second error code generator 840 using the information on the first error correction code present within the first error code generator 830. In particular, since the processing within the cyclic code generators is sequential, the content of the multiplicity of registers of the first error code generator 830 are transferred to the second error code generator 840 and copied into the corresponding registers of the same, using the initialization input 930 of the second error code generator 840. In doing so, the state of the second error code generator 240 is as if it had processed the first data packet 216a before and the processing of this first data packet 226a of the second data 226 can proceed further generating an joint error correction code, valid for both the first data packet 216a of the first data 216 and the first data packet 226a of the second data 226 as they are assembled within the combined data frame 810.

When finished with the first data packet 226a of the second data 226, the processing may continue in a like manner and the input of the registers of the second error code generator 840 are transferred to the first error code generator 830 which proceeds with the processing of the second data packet 216b of the first data 216. This exchange and initialization of the error code generators 830 and 840 proceeds until the data is completely processed, which is assumed to be the case when the third data packet 226c of the second data 226 is processed. At this instant, the second error code generator 840 holds an joint error correction code which is valid of the full sequence of data within the combined data frame 810 so that the joint error correction code 820 may be extracted from the second error code generator 840 and appended to the combined data frame 810 as illustrated in FIG. 8. That is, if a cyclic error correction code is chosen, embodiments may use both error code generators 830 and 840 associated to different data channels by providing an information on a first error correction code using a first cyclic code generator 830 processing the first data while the joint error correction code may then be provided by initializing the second cyclic code generator 840 using the information on the first error correction code and by using the initialized second cyclic code generator 840 to process the second data, resulting in the error correction code valid for both the first data and the second data.

As already elaborated on with respect to the embodiment illustrated in FIG. 2, also in the event of cyclic codes, it is not mandatory that the data packets of the first data and the second data are of the same width. Rather, different data packets of different length may be processed likewise, resulting in a valid joint error correction code.

In other words, FIGS. 8 and 9 illustrate an embodiment where data is assembled within a common data frame 810, while a cyclic redundancy code is processed independently in each of the data channels. A cyclic redundancy code may, for example, be generated using the particular implementation of FIG. 9. At the very beginning of the processing, a defined initialization may be performed, i.e. a defined CRC seed value may be loaded into the error code generator (CRC generator) of the channel that is delivering the data which is transmitted first within the combined data frame 810. In the embodiment of FIG. 8, this is assumed to be the first data channel. Once the first data package 216a is finished, the CRC registers of the CRC or error code generator 830 are read out and transferred to the CRC generator 840 where they are written to the corresponding registers as a new seed or start value. When the first data block or data packet 226a of the second data channel is processed by the second CRC generator 840, this first data packet 226a is added to the combined data frame 810. The process is continued by exchanging the CRC intermediate results between the two CRC generators 830 and 840 unless all data blocks are processed and a final CRC value is available within the CRC register of the CRC generator of the channel that provided the last data block. The final CRC completes the frame and is added at its end.

Figure 10:
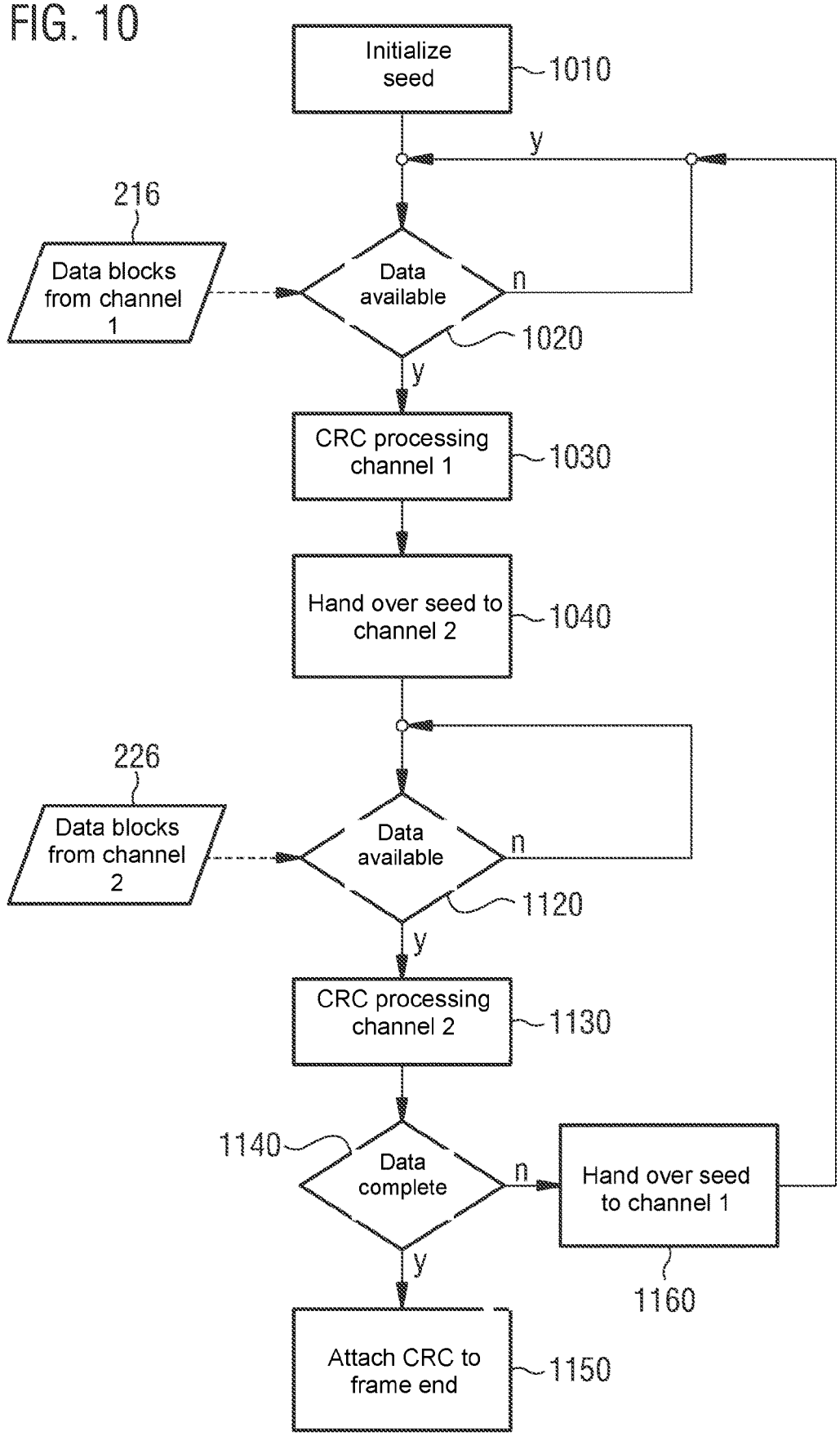
FIG. 10 illustrates a flowchart of method for providing an joint error correction code for a combined data frame as it may be implemented by the embodiment illustrated in FIG. 8.

FIG. 10 illustrates the processing within the embodiment of FIG. 8 by means of a flowchart. In a first optional initialization step 1010, the first error code generator 830 (the error code generator corresponding to the data to be transmitted first within the combined data frame 810) may optionally be initialized with an appropriate seed value. Then, in a step of data querying 1020, it is determined whether first data 216 is available to be processed. This querying is performed within a loop until there is the first data 216 to be processed. If this is the case, the information on the first error correction code is provided in an error correction code generation step 1030 using the first cyclic code generator 830. After this processing, the initialization values are handed over to the second cyclic code generator 840 in an initialization step 1040. In a second data querying step 1120, it is determined, whether second data 226 to be processed is available. The second cyclic code generator 840 is used to process the second data in a second error correction code generation step 1130. In the event that the data is complete, which is checked in a termination step 1140, the joint error correction code is received from the second error code generator 840 and attached to the combined data frame 810 in a finalization step 1150. In the event that the data to be submitted by the combined data frame is not complete yet, the first error code generator 830 is initialized by the information on the error correction code present within the registers of the second error code generator 840 in a further initialization step 1160 and processing is continued within a loop.

Figure 11:
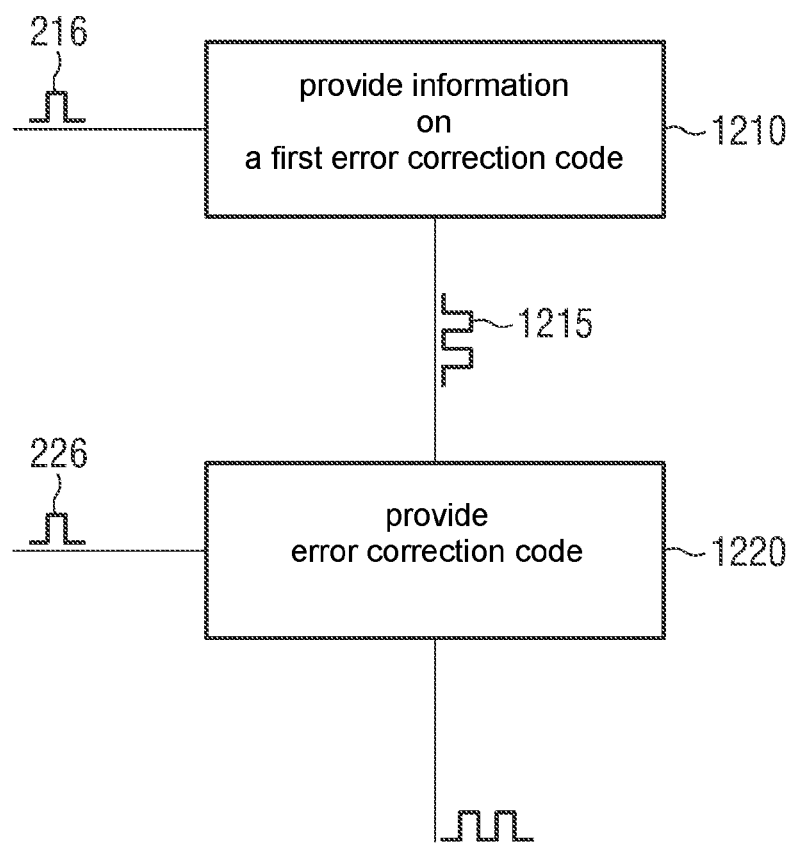
FIG. 11 illustrates a flowchart of an embodiment of a method for providing an joint error correction code for a combined data frame.

When a linear error correction code is used rather than the specific case of a cyclic code, the method performed by some embodiments may be more generally characterized as illustrated by means of the flowchart in FIG. 11. A method for providing a joint error correction code for a combined data frame comprising first data of a first data channel and second data of a second data channel provides, based on a linear code, information on a first error correction code 1215 using the first data 216 in a first provision step 1210. In a second provision step 1220, the joint error correction code is provided, based on the linear code, using the second data 226 and the information on the first error correction code 1215. Like discussed previously, the information on an error correction code may, e.g., be an intermediary computational result obtained during the generation of an error correction code for the first or second data or the final error correction code determined for the first or second data.

The aspects and features mentioned and described together with one or more of the previously detailed examples and figures, may as well be combined with one or more of the other examples in order to replace a like feature of the other example or in order to additionally introduce the feature to the other example.

Example embodiments may further provide a computer program having a program code for performing one of the above methods, when the computer program is executed on a computer or processor. A person of skill in the art would readily recognize that steps of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

All examples recited herein are principally intended expressly to be only for pedagogical purposes to aid the reader in understanding the principles of the disclosure and the concepts contributed by the inventor(s) to furthering the art without being construed as a limitation to the specifically recited examples and conditions. Further, all statements herein reciting principles, aspects, and embodiments of the disclosure, as well as specific examples thereof, are intended to encompass equivalents thereof.

Functional blocks denoted as "means" for performing a certain function shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant). Further, functions of various elements shown in the figures, including any functional blocks labeled as "means" may be provided through the use of dedicated hardware, such as "a processor", "a controller", etc. as well as hardware capable of executing software in association with appropriate software. Any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

What is claimed is:

1. A method, comprising:
    generating, by a first processor element of a device, a first error protection code using first data independent of a generation of second data;
    generating, by the device, a first data frame comprising the first data, first dummy data, and the first error protection code,
        a position of the first dummy data within the first data frame corresponding to a position of the second data within a second data frame;
    generating, by a second processor element of the device, a second error protection code using the second data;
    generating, by the device, the second data frame comprising the second data, second dummy data, and the second error protection code,
        a position of the second dummy data within the second data frame corresponding to a position of the first data within the first data frame; and
    generating, by the device, a joint error protection code for a combined data frame using the first error protection code and the second error protection code.

2. The method of claim 1, where generating the joint error protection code comprises:
    generating the joint error protection code using X-OR logic.

3. The method of claim 1, where a first error protection code generator, of the first processor element, is only able to access the position of the first data within the first data frame; and
    where a second error protection code generator, of the second processor element, is only able to access the position of the second data with the second data frame.

4. The method of claim 1, where the first data is generated at a first sensor; and
    where the second data is generated at a second sensor.

5. The method of claim 1, where the first data is split into a plurality of blocks;
    where the position of the first data, within the first data frame, corresponds to a particular block of the plurality of blocks; and
    where each of a set of positions, of the first data frame, correspond to a block of the plurality of blocks,
        the set of positions including the position of the first data corresponding to the particular block.

6. The method of claim 1, where the first data and the second data have an equal length.

7. The method of claim 1, further comprising:
    appending the first data with additional data.

8. A device, comprising:
    one or more sensors; and
    a plurality of processor elements to:
        generate a first error protection code using first data and independent of a generation of second data;
        generate a first data frame comprising the first data, first dummy data, and the first error protection code,
            a position of the first dummy data within the first data frame corresponding to a position of the second data within a second data frame;
        generate a second error protection code using the second data;
        generate the second data frame comprising the second data, second dummy data, and the second error protection code, a position of the second dummy data within the second data frame corresponding to a position of the first data within the first data frame; and generate a joint error protection code for a combined data frame using the first error protection code and the second error protection code.

9. The device of claim 8, where the plurality of processor elements, when generating the joint error protection code, are to:

combine the first data frame and the second data frame by an X-OR combination.

10. The device of claim 8, where the first data is split into a first plurality of blocks;

where the second data is split into a second plurality of blocks;

where the position of the first data, within the first data frame, is a first position corresponding to a particular block of the first plurality of blocks;

where the position of the second data, within the second data frame, is a second position corresponding to a particular block of the second plurality of blocks;

where each of a first set of positions, of the first data frame, correspond to a block of the first plurality of blocks, the first set of positions including the first position; and where each of a second set of positions, of the second data frame, correspond to a block of the second plurality of blocks, the second set of positions including the second position.

11. The device of claim 8, where the first data is generated by a first sensor of the one or more sensors; and where the second data is generated by a second sensor of the one or more sensors.

12. The device of claim 10, where the first set of positions of the first data frame correspond to a first set of positions of the combined data frame; and where the second set of positions of the second data frame correspond to a second set of positions of the combined data frame.

13. The device of claim 8, where the plurality of processor elements, when generating the first data frame, are to:

append the first data with a data identifier and timer information.

14. The device of claim 8, where the plurality of processor elements are further to:

add first redundancy or error correction code to the first data frame; and add second redundancy or error correction code to the second data frame.

15. A non-transitory computer-readable medium storing instructions, the instructions comprising:

one or more instructions, that when executed by a plurality of processor elements, cause the plurality of processor elements to:

generate a first error protection code using first data and independent of a generation of second data;

generate a first data frame comprising the first data, first dummy data, and the first error protection code, a position of the first dummy data within the first data frame corresponding to a position of the second data within a second data frame;

generate a second error protection code using the second data;

generate the second data frame comprising the second data, second dummy data, and the second error protection code, a position of the second dummy data within the second data frame corresponding to a position of the first data within the first data frame; and generate a joint error protection code for a combined data frame using the first error protection code and the second error protection code.

16. The non-transitory computer-readable medium of claim 15, where the one or more instructions, when executed by the plurality of processor elements, further cause the plurality of processor elements to:

add first redundancy or error correction code to the first data frame; and add second redundancy or error correction code to the second data frame.

17. The non-transitory computer-readable medium of claim 16, where the one or more instructions, when executed by the plurality of processor elements, further cause the plurality of processor elements to:

combine the first redundancy or error correction code and the second redundancy or error correction code to provide a joint redundancy or error correction code.

18. The non-transitory computer-readable medium of claim 17, where the one or more instructions, that cause the plurality of processor elements to combine the first redundancy or error correction code and the second redundancy or error correction code, cause the plurality of processor elements to:

combine the first redundancy or error correction code and the second redundancy or error correction code by an X-OR combination.

19. The non-transitory computer-readable medium of claim 15, where the one or more instructions, that cause the plurality of processor elements to generate the joint error protection code, cause the plurality of processor elements to:

combine the first data frame and the second data frame by an X-OR combination.

20. The non-transitory computer-readable medium of claim 15, where the first data is split into a first plurality of blocks;

where the second data is split into a second plurality of blocks;

where the position of the first data, within the first data frame, is a first position corresponding to a particular block of the first plurality of blocks;

where the position of the second data, within the second data frame, is a second position corresponding to a particular block of the second plurality of blocks;

where each of a first set of positions, of the first data frame, correspond to a block of the first plurality of blocks, the first set of positions including the first position; and where each of a second set of positions, of the second data frame, correspond to a block of the second plurality of blocks, the second set of positions including the second position.

* * * * *